Jan. 29, 1963 V. HABA 3,076,051

THERMOELECTRIC DEVICES AND METHODS OF MAKING SAME

Filed March 5, 1959

INVENTOR.
VINCENT HABA
BY Morris A. Rabkin
ATTORNEY

United States Patent Office 3,076,051

Patented Jan. 29, 1963

3,076,051

THERMOELECTRIC DEVICES AND METHODS OF MAKING SAME

Vincent Haba, Trenton, N.J., assignor to Radio Corporation of America, a corporation of Delaware Filed Mar. 5, 1959, Ser. No. 797,427
10 Claims. (Cl. 136—4)

The present invention relates to thermoelectrics, and more particularly to improved thermoelectric devices and to methods for making such devices.

Thermoelectric devices may be used in providing thermoelectric heat pumps suitable for heating and cooling. Electric power generation may also be accomplished with thermoelectric devices. Thermoelectric devices are, fundamentally, structures comprising bodies of dissimilar thermoelectric materials which are electrically interconnected. These dissimilar thermoelectric materials are categorized as either "N" or "P" types, depending upon the direction of the current flowing across a junction between the bodies of such materials producing heating or cooling at the junction.

Thermoelectric materials heretofore known and proposed for the above purposes have several disadvantages. For example, they are usually brittle and subject to fracture under rough handling. The heat pumping and/or power generating capacity of a single thermocouple formed by two bodies of dissimilar thermoelectric material is small as compared to the heat pumping and/or power generating capacity of a large number of such bodies. Heat due to Joulean losses decreases the heat pumping efficiency of thermoelectric devices.

Several devices have been constructed incorporating improvements for eliminating one or more of the foregoing disadvantages. While these devices have been more or less suitable for their intended purpose, they are not sufficiently flexible for universal application in thermoelectric apparatus useful for heating, cooling or power generation.

It is therefore an object of the present invention to provide improved thermoelectric devices wherein the foregoing disadvantages are eliminated, as well as to provide methods of making such devices.

It is another object of the present invention to provide improved thermoelectric devices which are protected against breakage and are therefore easily handled, and also to provide methods of making such devices.

It is still another object of the present invention to provide improved thermoelectric devices which contain a larger number of elements in a given area than was afforded by former thermoelectric devices and which therefore possess greater heat pumping and electrical power generating capacity than devices heretofore available, as well as to provide methods of making such improved thermoelectric devices.

It is a further object of the present invention to provide a method of making arrays of thermocouple elements of any desired size to thereby present cold and hot surfaces of any desired area.

It is a still further object of the present invention to provide improved thermoelectric devices and a method of miniaturizing such devices.

It is a still further object of the present invention to provide an improved thermoelectric panel device of lower cost than previous devices of this type, and also a simplified method of manufacturing such an improved thermoelectric panel device.

Briefly described, a thermoelectric device provided in accordance with the present invention may include a plurality of bodies of thermoelectric materials which are disposed in a matrix enveloping these bodies. The matrix includes a plurality of adjacent layers of insulating material, such as epoxy casting resins having different heat transfer properties, which results in greater heat pumping efficiency and establishes a steeper temperature gradient across the device.

A method of making the improved thermoelectric device in accordance with the invention may comprise the steps of arranging bodies of dissimilar thermoelectric material in an ordered array, and then casting one or more layers of insulating material so as to surround and bind said bodies in said ordered array. In this manner, a thermoelectric panel matrix may be provide which is a unitary structure which provides for ease of handling, protection against breakage and large heat pumping capacity.

The invention itself, both as to its organization and method of operation, as well as the foregoing and other objects and advantages thereof, will become more readily apparent from a reading of the following description in connection with the accompanying drawing in which.

Figure 1:
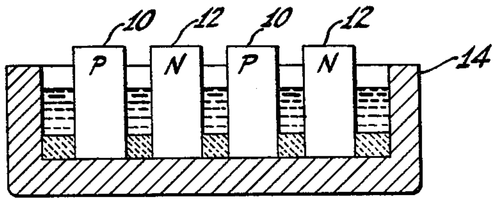
FIGS. 1 to 4 show a thermoelectric device provided by the present invention at different stages of manufacture.
Figure 2:
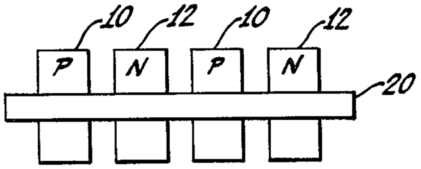
Figure 3:
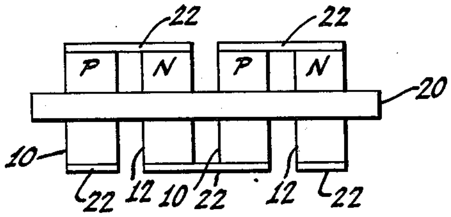
Figure 4:
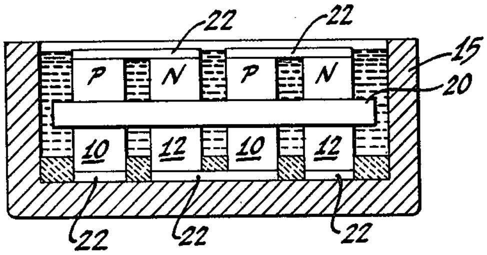

Referring, now, more particularly to FIGS. 1 to 5 of the drawing, a plurality of bodies 10 and 12 of thermoelectric material are shown. Some of the bodies, such as the bodies 10, are labeled with the letter "P," while the remaining bodies 12 are labeled with the letter "N." The material of the P-type bodies 10 and the material of the N-type bodies 12 are dissimilar thermoelectrically. The identification of the materials as being P or N types is in accordance with the conventions used in semiconductor technology. The preparation of P-type and N-type thermoelectric materials is not a part of the present invention. Examples of such materials are described in detail in patents issued in the name of Nils E. Lindenblad, Nos. 2,846,493 and 2,846,494. Another material from which the bodies 10 and 12 may be made is bismuth telluride which is properly alloyed with various minor impurities so as to provide N-type material for one group of bodies 12 and P-type material for the other group of bodies 10. The preparation of such materials is described in an application filed in the name of C. J. Busanovich, Serial No. 609,255 on September 11, 1956, now U.S. Patent 2,902,529, and assigned to Radio Corporation of America.

These thermoelectric materials are very brittle and are prone to crack or shatter if dropped or otherwise roughly handled. It is a feature of the present invention to provide a matrix containing a large number of bodies of thermoelectric material enveloped by another material which will protect the thermoelectric bodies against breakage.

While an array of sixteen bodies 10 and 12 of thermoelectric material is shown in the drawing for purposes of illustration, a much larger number of bodies of thermoelectric material may be used. As will be described hereinafter, many thermoelectric devices may be made by sub-dividing a large group of assembled elements into smaller groups.

Referring, now especially, to FIGS. 1 to 4, the method of making a thermoelectric device in accordance with the present invention will be set forth. A plurality of bodies of the thermoelectric material 10 and 12 are placed in an ordered array in a mold form 14. This mold form may be made of steel or cast iron, for example. The dissimilar P-type and N-type bodies of thermoelectric material are disposed alternately in rather closely adjacent relation. The bottom or base of the mold is flat. The end faces of the bodies of thermoelectric material are also flat. Each body of thermoelectric material is a rectangular slug of the same height and cross sectional dimensions. However, the bodies may also be round, triangular, hexagonal, or of any other convenient shape. The end faces of the bodies 10 and 12 which extend from the mold 14 are in a common plane, as are the opposite end faces which are disposed on the bottom of the mold. Any number of such bodies may be used. The heat pumping and power generating capacity of a thermorelectric device depends upon the number of thermocouple elements in the device. Accordingly, a large array of thermocouples may be provided in a thermoelectric device constructed in accordance with the invention. While the bodies of the thermoelectric material are shown as being of greater height than width, a thermoelectric device may be provided in accordance with the present invention wherein the bodies are of lesser height. The height of the bodies of thermoelectric material may be of the order of their width, if desired.

The entire thermoelectric device provided by the present invention may also be very small in size. The bodies 10 and 12 of thermoelectric material shown in FIG. 1 may be miniaturized to a large extent. For example, a thermoelectric device may be provided by the practice of this invention which contains bodies of thermoelectric material one-tenth the size of the bodies of thermoelectric material shown in the drawing. Such microminiaturization is made possible by the matrix arrangement of the thermoelectric elements, as will be described hereinafter.

After the bodies of thermoelectric material are disposed in ordered array in the mold 14, a material which is easily dissolved or which has a low melting point, such as wax, is poured into the mold. Enough of this material, which will be referred to as "wax" hereinafter to simplify the discussion, is poured into the mold to reach a level approximately one-third the height of the bodies of thermoelectric material. The wax forms a smooth surface at a level intermediate the ends of the bodies of thermoelectric material upon hardening. This intermediate level in the mold forms a base surface. After the wax has solidified, an insulating material is cast into the mold. Enough of this material is used to fill the mold to a point about two-thirds the height of the bodies of thermoelectric material. The material which is cast into the mold is desirably a plastic. A plastic of the epoxy type may be suitable. These epoxy plastics are epoxy resins which are in liquid form before pouring into the mold. The resins are self-setting at room temperature or a temperature slightly higher than room temperature. Thus, the use of epoxy resins simplifies the construction of the thermoelectric device provided by the invention. It is desirable that the material which is cast into the mold be heat resistant. This material should also have better heat transfer characteristics than other materials which will surround it. An epoxy resin with a filler of expanded mica is suitable. Another epoxy resin which will be found suitable for use in the casting process shown in FIG. 1 is identified by the trade name "Stycast 3050."

The material which is cast into the mold over the wax is therefore in the nature of a cement in this preferred embodiment of the present invention. The resin is permitted to solidify to provide a layer 20 intermediate the ends of the bodies of thermoelectric material. The epoxy resin in this layer 20 adheres to the bodies 10 and 12 and binds them in the ordered array in which they were placed in the mold 14.

The epoxy resin forming the layer 20 desirably has a coefficient of expansion substantially the same as the coefficient of expansion of the bodies 10 and 12. This characteristic of the layer 20 insures that the bodies of thermoelectric material will be maintained in the proper position in which they were placed in the mold 14. It has been found that, during operation of the thermoelectric device, the bodies of thermoelectric material may have various operating temperatures. Even adjacent ones of the bodies 10 and 12 may be at different temperatures. Since the coefficient of expansion of the layer 20 is substantially the same as the coefficient of expansion of the bodies 10 and 12, there will be no stress developed in the layer 20 and no consequent bending or warping of the layer. The bodies 10 and 12 will, therefore, be maintained in their ordered array. Another advantage of the use of a bonding layer 20 having substantially the same coefficient of expansion as the bodies 10 and 12 is that connectors, which will be described hereinafter, which are attached to the opposite ends of the bodies will not be loosened because of unwanted relative movements of the bodies.

The assembled bodies 10 and 12 may be removed from the mold after the layer 20 solidifies and sets. With the material identified above as "Stycast 3050," such solidification and setting will be accomplished after about twenty minutes to four hours, depending upon thickness of the layer and ambient temperature. The wax may be removed from the assembled bodies 10 and 12 and layer 20 by heating after removal of the assembled bodies from the mold. If a soluble material were used in place of wax, a solvent will be used at this point to remove the soluble material.

Figures 5, 6:
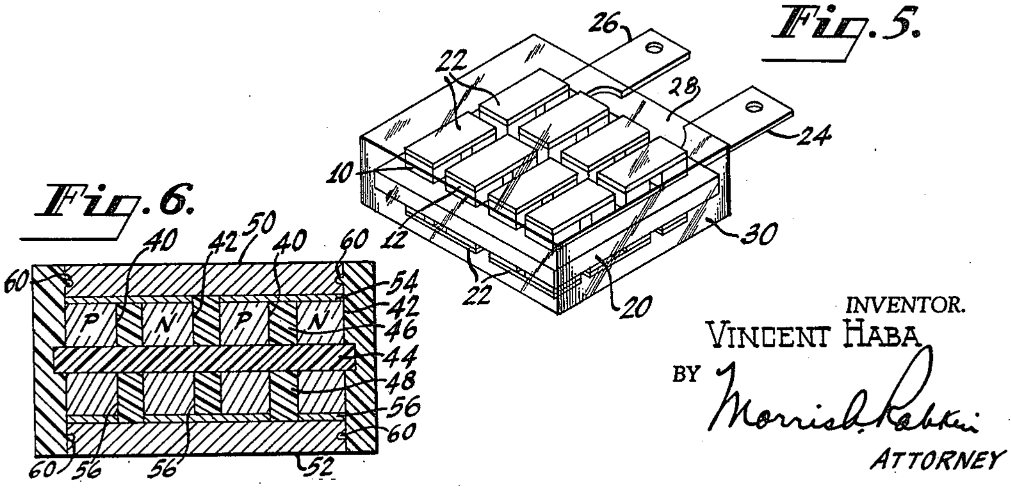
FIG. 5 is a perspective view showing a completed thermoelectric device provided in accordance with the present invention.
FIG. 6 is a sectional view of another embodiment of a thermoelectric device provided by the present invention.

Electrical connectors 22 in the form of copper plates are soldered to the ends of the bodies 10 and 12. The connectors are soldered to adjacent P and N type bodies to provide a continuous, series circuit through the bodies of thermoelectric material. The end ones of these connectors 22 may be extended to provide lugs 24 and 26, as shown in FIG. 5, for connection to a source of operating current for the thermoelectric device. Alternatively, if the device is used as a power generator, electrical current which is generated will be available at the lugs 24 and 26. The plate connectors 22 provide heat dissipating terminals or hot junctions on one side of the device and heat absorbing terminals or cold junctions on the other side of the device depending upon the direction of current flow.

The layer 20 intermediate the ends of the bodies 10 and 12 is heat resistant and therefore simplifies soldering. Also, the position of this layer 20, approximately one-third the distance from the ends of the bodies, simplifies the soldering operation since the entire surface of the ends of the bodies may be tin dipped and covered with solder by a simple dipping process. This soldering process provides a very low resistance bond. The process is described in detail in my copending patent application filed on September 14, 1956, Serial No. 609,940, now Patent No. 3,017,693. The process is particularly suitable for soldering the connectors to bismuth telluride materials. In accordance with the process, the surface of the bismuth telluride body is coated or dipped in a bismuth-antimony-tin solder and the conductor is coated or dipped in a tin-lead solder before joining the connectors and the bodies to each other.

After the connectors 22 are in place, the assembled bodies 10 and 12 of thermoelectric material, together with the intermediate layer 20 and the connectors 22, are placed in a mold 15, which is desirably somewhat larger than the mold 14. The surfaces of the lower connectors 22 are disposed on the bottom of the mold against the base of the mold. By casting, the mold is then filled with an insulating material different from the insulating material used for the layer 20. The difference between these materials is that the thermal conductivity or thermal coefficient of heat transfer of the material now cast into the mold 15 is lower than the thermal conductivity or thermal coefficient of heat transfer of the material of the layer 20. The material which is now cast into the mold 15 fills the mold to approximately the level of the top surface of the upper connectors 22. Thus, the surfaces of the upper connectors 22 and the surfaces of the lower the device have the feature of simplicity and the advantage of affording ease of construction. While I have shown two forms of thermoelectric devices according to my invention and methods of making such devices, various components and elements useful in such devices, as well as variations in the methods of making the devices, all coming within the spirit of the invention will, no doubt, readily suggest themselves to those skilled in the art. Hence, I desire that the foregoing be considered merely as illustrative and not in any limiting sense.

What is claimed is:

1. A thermoelectric panel which comprises a plurality of bodies of thermoelectric material spaced from each other and each having opposite end surfaces facing in opposite directions, a layer of solidified casting resin enveloping and adhering to a central portion of each of said bodies, connectors electrically joining different pairs of said end surfaces to establish an electrical circuit, and at least one other layer of solidified casting resin between said opposite end surfaces and surrounding said bodies of thermoelectric material and said first named layer, said first named layer having a higher thermal conductivity than said other layer.

2. The panel as set forth in claim 1 wherein said casting resins are of the epoxy resin type.

3. A thermoelectric device which comprises a plurality of bodies of thermoelectric material disposed in ordered array, a bonding layer of material comprising a solidified epoxy casting resin surrounding and adhering to a central portion of each of said bodies to maintain said bodies in said ordered array, a plurality of conductive terminals secured between different pairs of said bodies at the opposite ends thereof to establish an electrical circuit through said bodies, and other layers of material comprising another solidified epoxy casting resin having a thermal conductivity lower than that of said first-named resin, said other layers being disposed between said opposite ends of said bodies and around said first named layer.

4. A method of making a thermoelectric device including a plurality of bodies of thermoelectric material which comprises the steps of casting a layer of liquid casting resin around intermediate portions of said bodies, causing said resin to solidify and adhere to said bodies, connecting electrical terminals between different ends of said bodies, casting another liquid casting resin having a thermal conductivity higher than the thermal conductivity of said first-named resin around said bodies and said solidified layer, and causing said other material to solidify thereby providing a matrix of said thermoelectric bodies.

5. A method of making a thermoelectric device including a plurality of elements of thermoelectric material which comprises arranging said elements in ordered array in a mold having a first cross-sectional area, casting a first liquid resin into said mold, permitting said resin to solidify into a layer which binds said thermoelectric elements into a unitary structure, removing the bound thermoelectric elements from said mold, connecting conductive terminals between said elements at opposite ends thereof, placing the connected, bound thermoelectric element into another mold having a second cross-sectional area larger than said first cross-sectional area with the connectors at one end of said elements disposed against the base of said mold, casting another liquid resin having a lower thermal conductivity than that of said first resin into said last-named mold to envelop said bound thermoelectric elements while leaving the surfaces of said terminals exposed, and permitting said other resin to solidify.

6. A method of making a thermoelectric device including a plurality of elements of thermoelectric material which comprises arranging said elements in ordered array in a mold having a first cross-sectional area, casting a first liquid resin into said mold, permitting said liquid resin to solidify into a layer which binds said thermoelectric elements into a unitary structure, removing said bound thermoelectric elements from said mold, connecting conductive terminals between said elements at opposite ends thereof, placing a plate of conductive material having an electrically insulating coating on at least one face thereof into another mold on the base of said other mold with said one face exposed, placing said connected, bound thermoelectric elements into said other mold with the connectors at one end of said element in contact with said one face of said plate, placing another plate of conductive material having an electrically insulating coating on at least one face thereof against the terminals at the other ends of said elements with said one face of said other plate in contact with said terminals, casting another liquid resin having a lower thermal conductivity than said first resin into said last-named mold to envelop said bound thermoelectric elements said terminals and said plates while leaving the free surfaces of said plates exposed, and permitting said other casting resin to solidify.

7. A method of making a thermoelectric device including a plurality of bodies of thermoelectric material which comprises the steps of casting a layer including an epoxy casting resin around intermediate portions of said bodies, causing said resin to solidify and adhere to said bodies, connecting electrical terminals between different ends of said bodies, casting another material containing an epoxy casting resin having a thermal conductivity higher than the thermal conductivity of said first named epoxy casting resin around said bodies and said layer, and causing said other material to solidify thereby providing a matrix of said thermoelectric bodies.

8. A method of making a thermoelectric device including a plurality of bodies of thermoelectric material which comprises arranging said bodies in ordered array in a mold, pouring a material having a low melting point into said mold to cover a predetermined portion of said bodies, casting a first epoxy resin into said mold over said low melting point material, causing said epoxy resin to solidify so as to bind said thermoelectric bodies into a unitary structure, removing said bound together thermoelectric bodies from said mold, heating said bound thermoelectric elements to melt and remove said low temperature material therefrom, connecting conductive terminals between said bodies at opposite ends thereof, again placing said connected bound thermoelectric elements in a mold with the connectors at one end of said bodies disposed against the base of said mold, casting another epoxy resin having a lower thermal conductivity than said first epoxy resin into said last named mold to envelop said bound thermoelectric bodies while leaving the surfaces of said terminals exposed, and causing said other epoxy resin to solidify.

9. A method of making a thermoelectric device including a plurality of elements of thermoelectric material which comprises arranging said elements in ordered array in a mold, casting a first epoxy resin into said mold, permitting said epoxy resin to solidify to bind said thermoelectric elements into a unitary structure, removing said bound together thermoelectric elements from said mold, connecting conductive terminals between said elements at opposite ends thereof, again placing said connected bound thermoelectric elements in a mold with the terminals at one end of said elements disposed against the base of said mold, casting another epoxy resin having a lower thermal conductivity than said first epoxy resin into said last named mold to envelop said bound thermoelectric elements while leaving the surfaces of said terminals exposed, and permitting said other epoxy resin to solidify.

10. A method of making a thermoelectric device including a plurality of bodies of thermoelectric material which comprises arranging said bodies in ordered array in a mold, pouring a first material into said mold to cover about one-third of said bodies, casting a liquid plastic material into said mold over said first material to cover about an additional one-third of said bodies, permitting said plastic to solidify to bind said thermoelectric bodies into a unitary structure, removing said bound together connectors 22 will be exposed and not covered by the material now cast into the mold 15.

The latter casting material may be a plastic. A plain epoxy resin or cement will be suitable. Such resins are self-setting at room temperature and simplify the construction of the device. A suitable epoxy resin is "Araldite." This epoxy resins may be clear and uncolored. The characteristic of this epoxy resin which makes it preferred for use in manufacturing the device provided by the invention is that it has a lower thermal coefficient or thermal conductivity than that of the material used for the intermediate layer 20.

It has been found that the use of a dual layer structure comprising an intermediate layer of material having higher thermal coefficient and thermal conductivity than that of the material used for the outer layers 28 and 30 increases the efficiency of the thermoelectric device and increases the temperature drop obtainable with the device as measured from the hot junction to the cold junction. The hot junction, it will be appreciated, is formed by the connectors 22 on one side of the thermoelectric device and the cold junctions are formed by the connector 22 on the opposite side of the thermoelectric device for current flow through the bodies of thermoelectric material in one direction. The hot and cold junctions reverse for current flow in the opposite direction. While the reason for such increased efficiency and increased temperature drop has not been ascertained at this time, a probable theory is that the layer of higher thermal conductivity permits the dissipation of Joulean heat from the bodies while the layers of lower thermal conductivity prevent the back flow of heat from the hot junctions to the cold junctions.

After the material cast into the mold 15 on opposite sides of the layer 20 has solidified and set, the entire device may be removed from the mold. The upper and lower surfaces of the device which are in the plane of the connectors 22 may be buffed to insure that none of the epoxy resin adheres to the connectors. It will be observed that the thermoelectric device which has been provided by the practice of the process illustrated in connection with FIGS. 1 to 4 is a matrix of thermocouple elements. By the term "matrix" is meant the enveloped elements from which thermoelectric effects may be derived. The term "matrix" also applies to the ordered array of elements which are assembled in accordance with the practice of the invention.

It will be observed that the matrix may be sub-divided into smaller units by merely cutting or sawing through the layers of enveloping insulating plastic material 28, 20 and 30 between adjacent bodies 10 and 12. The layers 28 and 30 are provided upon solidification of the final casting resins and these layers extend from the opposite sides of the intermediate layer 20 to the end faces of the connectors 22 on the cold and hot junction sides of the matrix.

The thermoelectric matrix may be readily applied as a heat pump. The surface of the matrix containing the hot junction connectors 22 may be disposed against the body to be cooled. For example, the cold junction surface may form the walls of a refrigerator chamber. Suitable heat dissipating means, such as fins or a large conductive element, may be disposed adjacent the hot junction surface of the matrix. It should be noted, however, that insulation should be provided between the connectors 22 and a conductive heat dissipating member. Such insulation may be a thin sheet of plastic material as described in a patent, No. 2,872,788, issued in the name of Nils E. Lindenblad on February 10, 1959.

Another embodiment of the present invention wherein heat is dissipating members may be assembled integrally with the matrix is shown in FIG. 6. The bodies 40 and 42 of P-type and N-type material, respectively, are shown maintained in properly assembled relationship by a plurality of layers of insulating material 44, 46 and 48. The intermediate layer 44 desirably has a higher thermal conductivity than the outer layers 46 and 48 and a lower coefficient of expansion.

Plates 50 and 52 of conductive material having excellent thermal conductivity are assembled integrally with the matrix. The illustrated plates 50 and 52 are anodized aluminum. The plates are anodized in order to provide electrical insulation. The plates 50 and 52 are disposed in contact with the hot junction connector terminals 54 and the cold junction connector terminals 56, respectively. During the final casting process, when the layers 46 and 48 are formed, additional casting resin is added to cover the edges of the plates 50 and 52. The casting material bonds with the plates and enters within the notches 60. Side layers 58 and 59 are therefore provided which adhere to the end ones of the bodies of thermoelectric material 40 and 42 and to the edegs of the plates 50 and 52. The plates 50 and 52 provide large area heat dissipating and heat absorbing terminals. The thermoelectric panel matrix, including the integral plates and the bonding layers, is very sturdy and may be used directly in heating, cooling or power generating equipment. The plates 50 and 52 will provide the hot or cold surfaces. When power generation is desired, a temperature gradient may be established across the panel by heating either the plate 50 or 52.

Another method of the manufacture of a thermoelectric device provided in accordance with the invention may be practiced. In accordance with this method, the connectors 22 may be initially soldered to the lower ends of separate pairs of the P and N type bodies 10 and 12 so as to provide a number of pairs of P and N type bodies having connector plates at one end thereof. These bodies may be arranged in the mold with the connector plates disposed at the bottom of the mold. The arrangement may be in an ordered array as previously described. The layer of epoxy resin 30 may then be cast into the mold. This layer will cover the connectors 22 and may extend to approximately one-third the height of the bodies. It will be observed that a layer of wax is not used in practicing this method of making a thermoelectric device provided by the invention. After the layer 30 has solidified, the intermediate layer 20 may be cast. Upon solidification of the intermediate layer 20, the other connectors 22 may be soldered to the exposed end of the bodies of thermoelectric material 10 and 12. When the solder is cooled and the connectors are permanently attached to the bodies, the final layer of epoxy resin may be cast into the mold. When this final layer has solidified and set, the assembled matrix of thermoelectric elements may be removed from the mold. It will be observed that the foregoing method simplifies the construction of the thermoelectric matrix to some extent.

In making a thermoelectric device similar to the device described in connection with FIG. 6 of the drawing, the foregoing method will be practiced. However, an initial step in practicing the method will be to place the anodized aluminum plate 52 at the bottom of the mold. Then, the pairs of bodies of thermoelectric material having the bottom connectors 56 attached thereto may be placed in ordered array on the upper surface of the aluminum plate 52. The lower and intermediate layers of epoxy resin may then be cast, successively, into the mold. Following soldering of the other connectors 56 to the exposed ends of the bodies of thermoelectric material, the upper anodized aluminum plate 50 may be placed on top of the upper connectors 54 and the final layer of epoxy resin cast into the mold. The completed device may then be removed from the mold.

From the foregoing description, it will be apparent that I have provided an improved thermoelectric device and several methods of making the same. The device is more rugged, more easily handled, more efficient and more readily miniaturized than other thermoelectric devices which are now available. The methods of making thermoelectric bodies from said mold, removing said first material from said bound thermoelectric elements, soldering conductive terminals between said bodies at opposite ends thereof, again placing said connected bound thermoelectric bodies in a mold with the connectors at one end of said bodies disposed against the base of said mold, casting another liquid plastic material having a lower thermal conductivity than said first epoxy resin into said last named mold to envelop said bound thermoelectric bodies while leaving the surfaces of said terminals exposed, and permitting said other plastic material to solidify to provide a matrix of thermoelectric bodies.

References Cited in the file of this patent

UNITED STATES PATENTS

| | | |
|---|---|---|
| 1,848,655 | Petrik | Mar. 8, 1932 |
| 2,289,152 | Telkes | July 7, 1942 |
| 2,626,970 | Hunrath | Jan. 27, 1953 |
| 2,701,392 | Eich | Feb. 8, 1955 |
| 2,713,700 | Fisher | July 26, 1955 |
| 2,749,716 | Lindenblad | June 12, 1956 |
| 2,872,788 | Lindenblad | Feb. 10, 1959 |
| 2,886,618 | Goldsmid | May 12, 1959 |
| 2,903,857 | Lindenblad | Sept. 15, 1959 |
| 2,906,801 | Fritts | Sept. 29, 1959 |